United States Patent [19]

Rosenfeldt et al.

[11] Patent Number: 4,479,263
[45] Date of Patent: Oct. 23, 1984

[54] DEVICE FOR ACQUIRING AND PROCESSING ELECTRICAL SIGNALS

[75] Inventors: Bernd Rosenfeldt; Gerhard Weller; Arthur Wondra; Edmund Reis, all of Erlangen, Fed. Rep. of Germany

[73] Assignee: Siemens Aktiengesellschaft, Berlin & Munich, Fed. Rep. of Germany

[21] Appl. No.: 262,213

[22] Filed: May 8, 1981

[30] Foreign Application Priority Data

May 22, 1980 [DE] Fed. Rep. of Germany ....... 3019668

[51] Int. Cl.³ .............................................. H04B 9/00
[52] U.S. Cl. .................................... 455/602; 361/390; 361/391; 361/394
[58] Field of Search ................ 455/603, 602; 361/390, 361/391, 393, 394

[56] References Cited

U.S. PATENT DOCUMENTS

| 3,199,938 | 8/1965 | Vouk . | |
|---|---|---|---|
| 3,253,190 | 5/1966 | Evans | 361/394 |
| 3,858,091 | 12/1974 | Wilkinson | 361/390 |
| 4,012,089 | 3/1977 | Ward . | |
| 4,038,625 | 7/1977 | Tompkins et al. . | |
| 4,232,356 | 11/1980 | Saunders et al. | 361/391 |
| 4,236,086 | 11/1980 | Hoebel . | |

FOREIGN PATENT DOCUMENTS

| 42019 | 4/1979 | Australia . |
|---|---|---|
| 0040753 | 12/1981 | European Pat. Off. . |
| 1276684 | 9/1968 | Fed. Rep. of Germany . |
| 2046952 | 3/1972 | Fed. Rep. of Germany . |
| 2348687 | 10/1974 | Fed. Rep. of Germany . |
| 1366134 | 9/1974 | United Kingdom . |
| 1383577 | 2/1975 | United Kingdom . |
| 1447469 | 8/1976 | United Kingdom . |

Primary Examiner—Joseph A. Orsino, Jr.
Attorney, Agent, or Firm—Hill, Van Santen, Steadman & Simpson

[57] ABSTRACT

In an exemplary embodiment, a device housing with a signal processing part, includes at least one recess into which at least one insert with a cladding of insulation material of high electric strength can be inserted as a signal transmission part, whereby both the recess wall and the insert are carriers of mutually cooperating primary and secondary coupling elements of a galvanically separating coupling location for energy and signal transmission, the coupling elements, however, only combining to form the coupling location when the insert is inserted into the recess. The object of the disclosure is to create such a device which allows of combinations consisting of the recess and the insert which are dimensioned to provide as large a volume or as large a surface area as desired without having a leakage current which may be possibly flowing assuming an inadmissibly high value as a result. This object is achieved in that the recess in the device housing is lined with an insulating body likewise of insulating material of high electric strength or that such an insulating body itself forms the recess, with the insulating body finally accepting the insert in its interior space.

21 Claims, 11 Drawing Figures

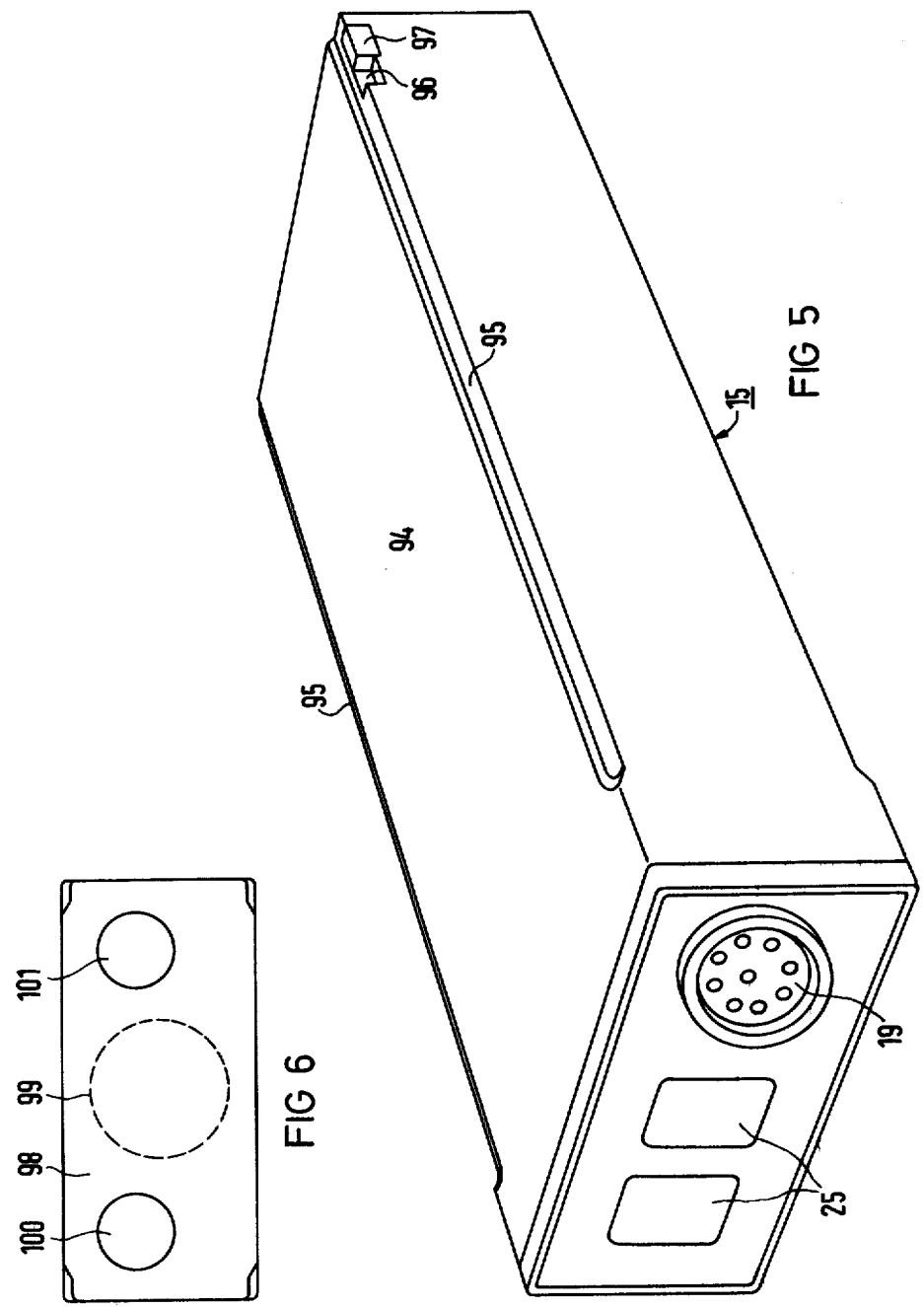

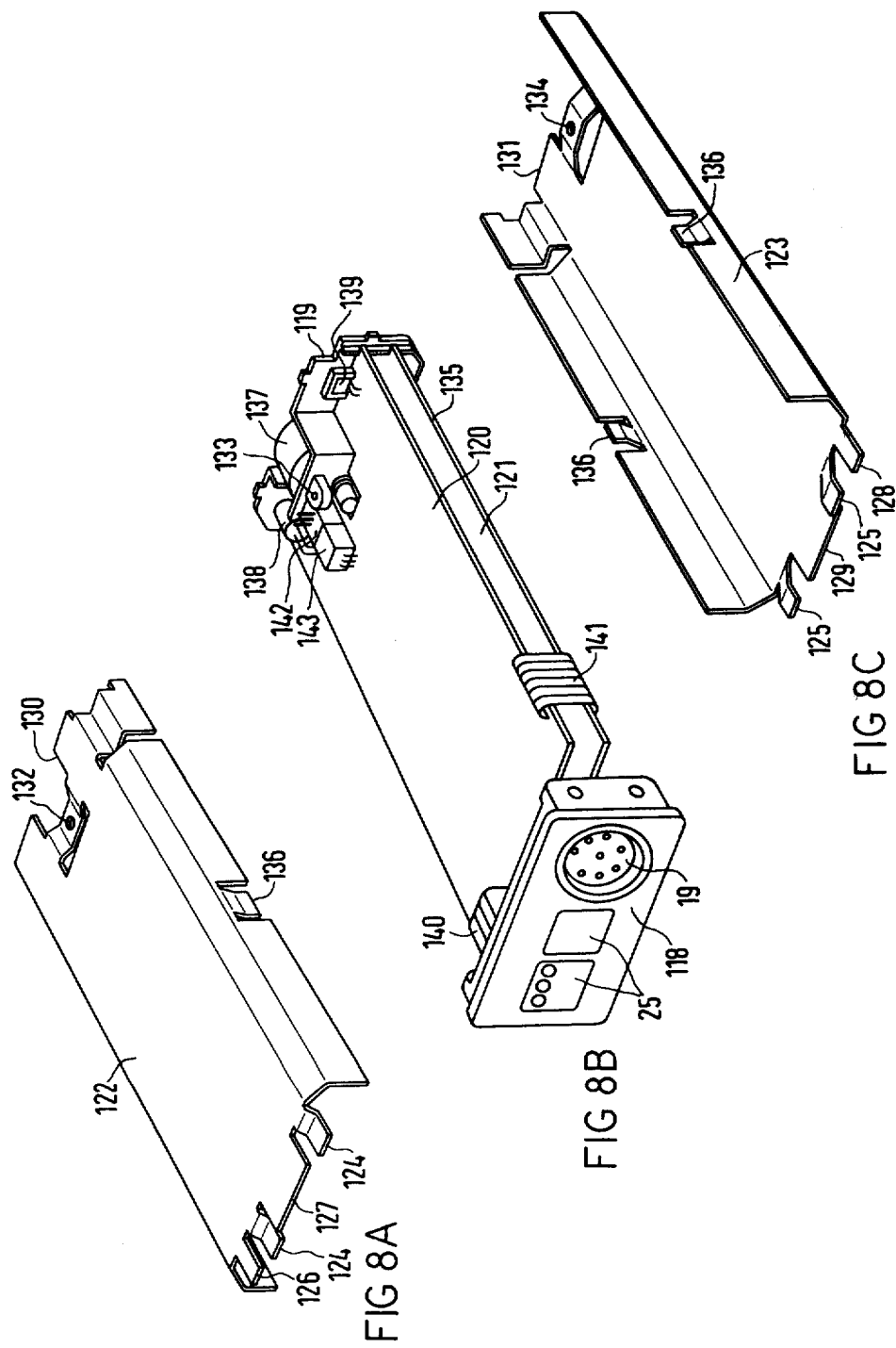

DEVICE FOR ACQUIRING AND PROCESSING ELECTRICAL SIGNALS

BACKGROUND OF THE INVENTION

The invention relates to a device for acquiring and processing electrical signals, comprised of a device housing with a signal processing part, said housing exhibiting at least one recess into which at least one insert housing with a cladding of insulation material of high electric strength can be inserted as a signal transmission part, whereby the recess wall and the insert housing are carriers of mutually allocated primary and secondary coupling elements of a galvanically separating coupling location for energy and/or signal transmission, said coupling elements, however, only combining to form a coupling location when the insert housing is inserted into the recess.

A device of this type is known, for example, from the German Utility Model No. 77 36 156 (or German Patent No. 2,752,783). In this device, which is particularly a matter of acquiring and processing physiological test signals such as electrocardiograph signals, pressure signals, temperature signals and the like of a patient, the recess is fabricated of nonmagnetic but nonetheless electrically conducting material (for example, aluminum) and the insert housing fitting thereto preferably is of synthetic material with an inside metallization. A particularly large surface plug contact is created with this format; relatively long air and leakage paths derive for leakage currents which may be flowing. The electric strength is increased by a multiple and insulation problems no longer occur.

Beyond that, the British Pat. Nos. 1,383,577, 1,366,134 and 1,447,469 are also worthy of mention from the general prior art. The British Pat. No. 1,383 577 likewise discloses a device of the type initially cited which is employed for the transmission of energy and telemetry signals in ships. A significant feature of the plug arrangement employed in said device is that both the recess and the insert housing are constructed of a stack of magnetic plates. A further feature is that the arrangement is provided for use in sea water. In order to avoid direct contact between the magnetic plates and the sea water, thus, each stack of magnetic plates, in addition to an air gap of a few millimeters interrupting the magnetic circuit, is also provided with a protective cladding consisting of a material which is not described in greater detail. The device of British Pat. No. 1,383,577, thus, is particularly concerned with the problem of protecting a plug-type connection against sea water. The problem of electric strength and of particularly good protection against leakage currens is not addressed. The remaining two publications British Pat. Nos. 1,366,134 and 1,447,469, finally, show examples of coupling locations in which, for the transmission of energy, coils are employed as the primary and secondary coupling elements or, respectively, lightwave guides are employed for the transmission of signals as the primary and secondary coupling elements.

In view of the specific problem erection, namely, a desire for a particularly high electric strength given optimum insulation of the coupling location, the present invention, however, proceeds from a device according to the German Utility Model 77 36 156 (or, respectively, German Pat.No. 2,752,783). The plug-type connection employed in said device functions optimally insofar as the recess and the insert housing fitting to the recess remain, in terms of their dimensions, within a certain dimension range. If the dimensions, however, exceed said dimension range, i.e., if the recess and the insert housing are designed with a greater volume or, respectively, with a greater surface, then problems with respect to the leakage current again arise. The leakage current increases in an undesirable manner.

SUMMARY OF THE INVENTION

The object of the invention is to construct a device of the type initially cited which allows of combinations comprised of recess and insert housing dimensioned with any desired volume or surface area without having a leakage current which may possibly be flowing, assuming an inadmissably high value.

The object is inventively achieved in that the recess in the device housing is lined with an insulating body of insulating material with a high electric strength or such an insulating body itself forms the recess, said insulating body, finally, accepting the insert housing into its interior space.

The invention proceeds from the perception that a higher-volume or, respectively, greater-surfaced design of the combination comprised of recess and insert housing leads to a rapid rise of the capacitance between the metal parts of the recess and the metal parts of the insert housing given a direct contact between the parts. The higher capacitance, however, causes a higher value of the leakage current insofar as such a current is flowing. The invention, however, avoids said disadvantage by means of employing an insulating body. Such an insulating body reduces the capacitance; even given a relatively large-volume or large-surface design of the housing of the plug-type connection, the value of the leakage current remains low.

In an advantageous embodiment of the invention, an insert formed of nonmagnetic but, nonetheless, electrically conductive material, for example, aluminum or sheet steel (e.g. stainless steel), can be lined with an insulating body. Just as advantageously, an insulating body which itself forms the recess can be clad at its outer walls, at least partially, but, preferably on all sides, with plates consisting of nonmagnetic but, nonetheless, electrically conductive material, for example, aluminum or sheet steel. There is also particular interest in the fact that an insulating body is created which creates optimally low capacitances but which is nonetheless relatively simple in format and is economical at the same time. In an advantageous embodiment of the invention, this is achieved in that the insulating body exhibits ribs at its perimeter which hold the interior wall of the insulating body, (while enclosing insulating layers consisting of air), at a prescribable distance from the electrically conductive material of the housing recess or the plates cladding the insulating body as a recess. Thereby, the rib bodies are expediently shaped of selected insulating material with a specific dielectric constant (particularly ABS =amino-butadiene-styrol) in such manner that the insulating material limits the capacitance prevailing between metal parts in the inside and metal parts outside of the rib body to a value below 130 pF (referred to an operating voltage of 220 V and an operating frequency of 50 Hz). A rib body, thus, limits the value of the capacitance given a minimum of material outlay. Given a relatively simple format of the insulating body, thus, considerable material is saved so that the insulating body also becomes particularly economical overall.

Further advantages and details of the invention proceed from the following description of an exemplary embodiment on the basis of the drawings in conjunction with the remaining subclaims; and other objects, features and advantages will be apparent from this detailed disclosure and from the appended claims.

BRIEF DESCRIPTION OF THE DRAWINGS

FIG. 5 shows an inventive insert housing in an oblique view;

FIG. 6 shows the back surface of an insert housing according to FIG. 5;

FIG. 8 comprised of FIGS. 8A, 8B, and 8C shows the internal format of an insert.

DETAILED DESCRIPTION

Figure 1:
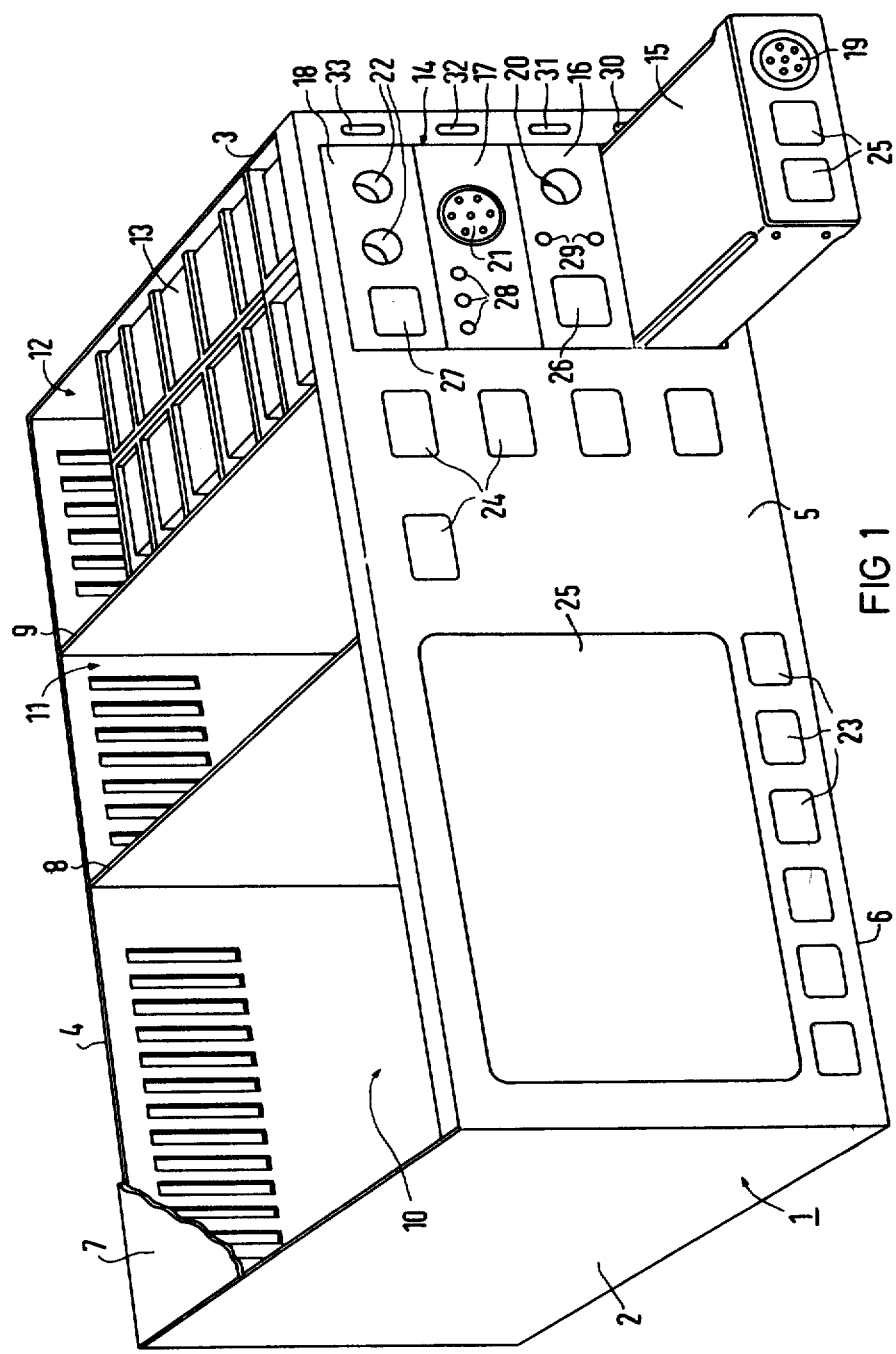
FIG. 1 shows a device according to the invention in an oblique view.

FIG. 1 shows the device with a device housing 1 constructed in dimensions specified in inches with sidewalls 2 and 3, a back wall 4 and a front panel 5, a bottom plate 6 as well as the cover plate 7 which is only illustrated partially. The device housing 1 is subdivided in its inside into three compartments 10, 11, and 12 by means of, for example, two partitions 8, 9. A cathode ray tube (not illustrated) for displaying signals is mounted, for example, in the compartment 10. The compartment 11, for example, accepts printed circuit boards with components for signal processing or, respectively, for signal display. On the other hand, the compartment 12 serves for the acceptance of the inventive insulating body 13 which is designed as a box open toward the front into whose inside a total of four device inserts 15, 16, 17, and 18 can be inserted proceeding from the front opening 14. The compartment 12 of the device housing, thus, can also be defined, for example, as a recess which is lined with an insulating body 13 which in turn serves for the acceptance of inserts. However, the insulating body 13 itself can just as easily be designated as providing a recess which serves for the acceptance of device inserts. The device inserts are a component of the signal transmission system. On the inside, they can be constructed circuit-wise as is extensively described, for example, in the German Utility Model No. 77 36 156 (or, respectively, German Pat. No. 2,752,783). What is essential, however, is that each insert exhibits a cladding of insulating material with a high electric strength which, in addition to the printed circuit boards with components and metal shielding for said components, also carries the first half elements of a coupling location for energy and signal transmission in its inside, whereas the second half elements fitting thereto are specifically seated in the back surface of the insulating body 13 with a connection to the free space of the compartment 12, as shall be described in detail farther below.

The device illustrated in FIG. 1 is, specifically, an electromedical device. The inserts 15 through 18, thus, are a part of the signal transmission system for physiological signals which are taken at the body of a patient by means of suitable sensors. To this end, thus, the sensors (not illustrated) are positioned on the body of the patient and are coupled via a signal cable (likewise not illustrated) to the respective inserts 15 through 18. The inserts 15 through 18, to this end, exhibits sockets 19 through 22 for the corresponding plugs of the signal cable. Of course, the employment of inserts in which the sensors are always permanently connected to the respective insert via signal cables (i.e., not in a plug-type connection) is also possible. The latter case is available when the individual insert housing is designed so as to be relatively low-volume. The insert with the permanently connected cable is then to be interpreted as the device plug itself.

In the exemplary embodiment of FIG. 1, the front panel 5 is specifically designed as a foil covered plate. All operating and/or display elements, thus, lie in the plane of the foil as is indicated by the symbols 23, 24. The same also applies to the image transmitting window 25 for the picture screen of the cathode ray tube to be incorporated or, respectively, also applies to the front surfaces of the inserted inserts 15 through 18. The front surfaces of the inserts, thus, likewise lie in the foil plane of the front panel 5 together with the incorporated operating and display elements 25 through 29 (28 and 29, for example, are luminescent diodes) which are only schematically illustrated. The disposition in one plane prevents the attachment of handles at the inserts with whose assistance plugged-in inserts can again be withdrawn from the recess of the device housing. In order, nonetheless, to be able to guarantee a rapid interchange of inserts, each insert is therefore specifically equipped with a discharge mechanism at the back wall of the insulating body 13, said discharge mechanism coming into action when a locking device which locks the insert in the hollow space after it has been inserted is released by means of manual actuation of an unlock key disposed at the device housing. The individual unlock keys for the inserts are indicated in FIG. 1 at the extreme right-hand edge of the front panel 5 and are referenced with the numerals 30 through 33. Further details relating to the format and functioning of the discharge mechanism in conjunction with the locking device are described farther below. In the exemplary embodiment of FIG. 1, 15, for example, is a $CO_2$ insert, 16 is an insert for pressure measurement, 17 is an insert for electrocardiographic measurement and 18 is a temperature insert. Of course, the insertion of any other insert for a different measurement signal is possible.

Figure 2:
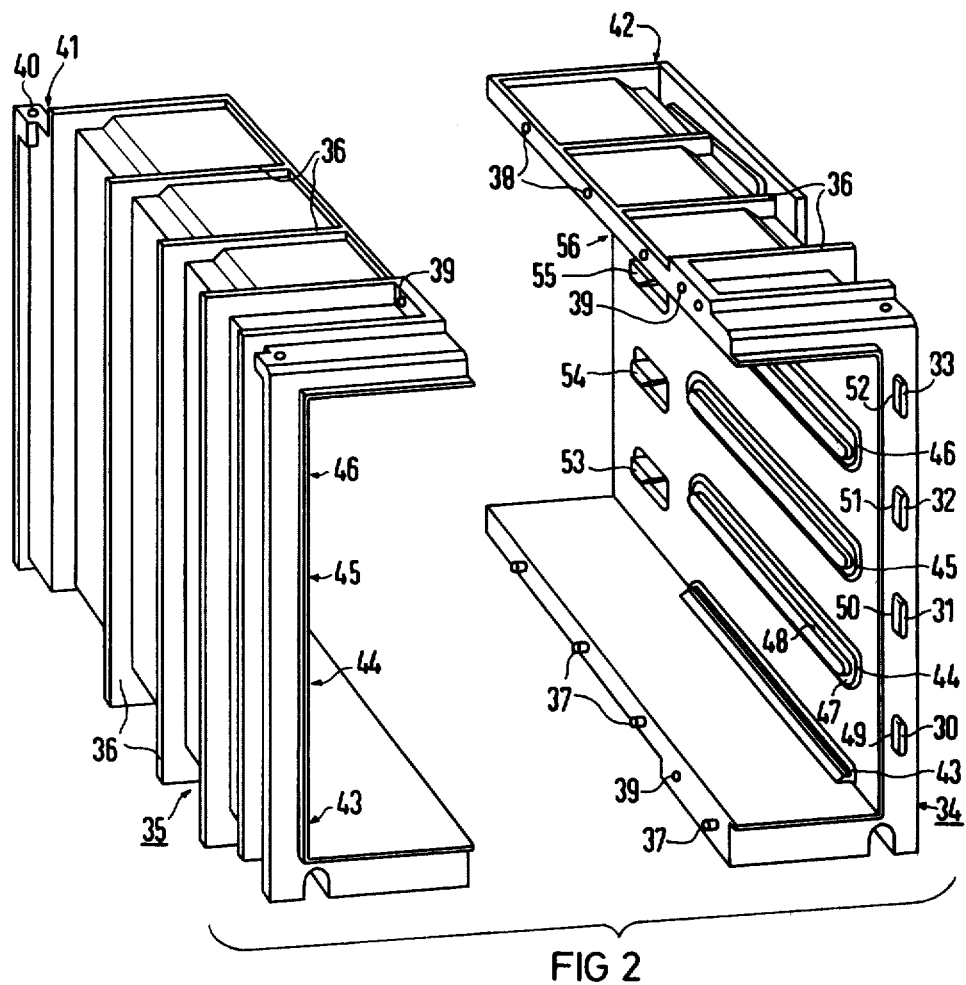
FIG. 2 shows an insulating body to be constructed of two mating C-shaped parts.

According to FIG. 2, the insulating body 13 is composed of two mating C-shaped parts 34 and 35. Both C-shaped parts are fabricated of synthetic amino-butadiene-styrol (ABS) which is easy to shape and which, moreover, is relatively price-favorable as well. In order, given a relatively large outside surface of the insulating body, to make do with as little insulating material as possible, the two parts 34 and 35 are specifically shaped as ribbed bodies. Each of the parts 34 and 35, thus, comprises ribs 36 at its perimeter which keep the inside wall of the insulating body, upon insertion of insulating layers consisting of air between the ribs, at a prescribable distance from the metal walls of the housing compartment 12. In the present case, the depth of the grooves, particularly at the sidewalls of the parts 34, 35, amounts to approximately 7 mm. At the upper and lower surfaces of the parts 34, 35, the depth is decreased to a value up to approximately 3 mm for reasons of assembly. The thickness of the ribs amounts to approximately 1.5 mm. The material width of the inside wall of the parts 34, 35 amounts to approximately 3 mm. The insulating body composed of the two C-shaped parts 34 and 35 when assembled exhibits an outside width and depth of two inches by eight inches, measured from outside rib to outside rib. The height of the box-shaped insulating part lies at approximately 180 mm (corresponding to four height units). In the present exemplary embodiment, this dimensioning of the rib body 13 and the selection of the corresponding insulating synthetic material leads to the fact that the capacitance between the metal parts within the housing of the inserts 15 through 18 and metal parts outside of the insulating body 13 (shielding walls of the compartment 12 of the device housing or, respectively, metal parts situated at the back wall of the insulating body 13) is limited to a value of less than 130 picofarads (<130 pF) related to an operating voltage of 220 V and an operating frequency of 50 Hz. Given this capacitance, an operating current which may possibly be fluctuating is at a safely low level of less than ten microamperes (<10 μA).

In FIG. 2, the two parts 34 and 35 of the insulating body have pins 37 at the mutually facing assembly edges at respectively one assembly edge of the one half part which fit to corresponding adjustment holes 38 at the mating edge of the other half part. After assembly of the two parts 34 and 35, said parts are screwed to one another at the assembly strips at the front via aligned screw holes 39 at the upper surface and corresponding aligned screw holes 39 at the base, so that only two screws secure the C-shaped parts 34, 35 together at the front. The analogous case applies to two corner screw holes 40 at the back of the upper surface of the C-shaped parts (only one hole 40 being visible in FIG. 2). The corner screw holes 40 are aligned with corner holes at the upper edge of an attachable back wall to fasten said back wall with parts 34, 35. The lower surfaces of the two C-shaped parts 34, 35, on the other hand, are pressed together at the back side by means of a specific shaping of the back wall which can be inserted into two grooves 41, 42 at the back longitudinal edges of the assembled C-shaped parts 34 and 35. When the back wall is inserted, the insulating body 13 composed of the two parts 34, 35 forms a box which is opened toward the front, into which the inserts can be inserted. For drawer-like insertion of the individual inserts 15 through 18, the two parts 34, 35 have longitudinal tracks 43 through 46 at their respective inside walls. Said longitudinal tracks are shaped in such manner that a relatively flat wall camber 47 is followed by a more greatly cambered longitudinal ridge 48 (illustrated on the example of track 44). This results in the fact that the insert to be inserted, carried by the respective ridge 48 of a guide rail 43 through 46, has its exterior sidewalls in sliding relation only to the slight camber 47, i.e., the exterior sidewalls of the insert do not slide against the inside wall of the insulating body at the entire lateral surfaces thereof. By so doing, a particularly low-friction operation of each insert ensues. The ridge cambers are slightly rounded; the cambered central ridge 48 fits to a corresponding slide channel at the longitudinal edges of each insert. Slide ridges 43 through 46 and slide channels at the inserts not only ensure low-friction sliding because of their rounded nature; the rounded ridges and glide channels also avoid sharp edges at which dirt easily builds up. This type of gliding seating is thus also optimally designed from the viewpoint of cleanliness. In FIG. 2, finally, the unlock keys for the system of locking levers are again indicated at the right-hand outside edge of the part 34 with 30 through 33. Thereby, the unlock keys 30 through 33 project from openings 49 through 52 of the edge of the part 34 to such an amount that, after assembly of the insulating body in the compartment 12 of the device housing 1, the end face of each catch key lies approximately in the plane of the cover foil of the front panel 5 when the front surface of the plate forming panel 5 is covered with the foil. The actuation of an unlock key 30 through 33 then ensues by means of pressure against the foil at the location of the unlock key. Pressing an unlock key 30 through 33 effects that, specifically in the present case, a catch lever is actuated via a lever system. The catch noses or latches of the respective catch lever which respectively engage in a groove at a lateral edge of the insert when the insert is in its inserted state are referenced with 53 through 56 in FIG. 2 at the back, inside of the right part 34. Further details concerning the format and functioning of the locking device proceed from the description to FIG. 4 which is yet to follow.

Figure 3:
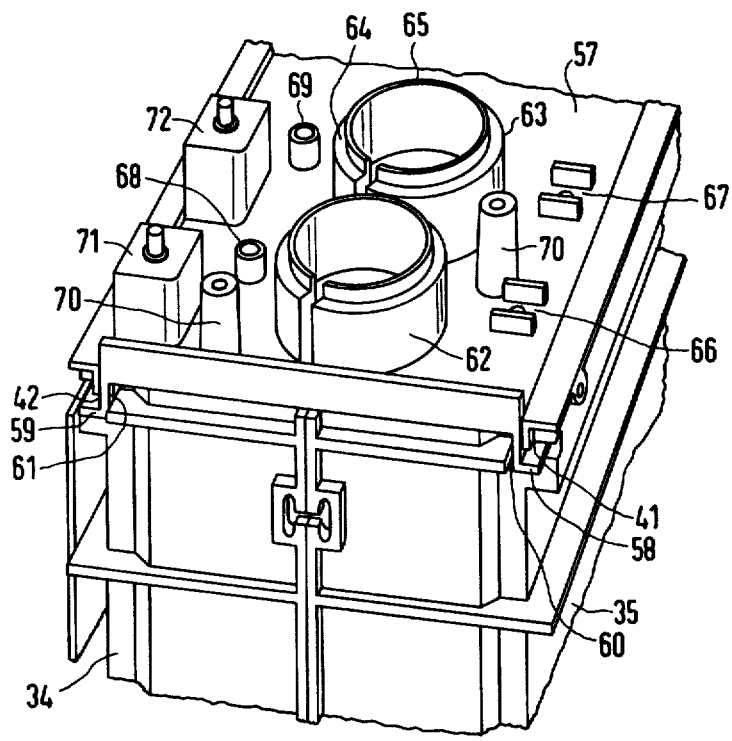
FIG. 3 shows the insulating body with attached back plate in a partial perspective view.

FIG. 3, in a partial view, shows the C-shaped insulating parts 34 and 35 (combined to form an overall body) obliquely from below and rotated by approximately 180° in comparison to the illustration of FIG. 2. The back plate 57 inserted into the grooves 41 and 42 is now also shown. Shortly before complete insertion of the plate 57, the flanged edges 58 and 59 of said back plate slide at their lowest end over two slightly inclined surfaces 60 and 61 at the back lower edges of the two C-shaped parts 34 and 35. Thus, the edges 58 and 59 exert pressure against the base portions of the two C-shaped parts 34, 35 via the increasing oblique surfaces 60 and 61. The two parts 34, 35 are pressed together at this location and thereby adhere well to one another to provide an encompassing insulating shell for surrounding the inserts 15–18, FIG. 1. The back plate 57 likewise consists of synthetic insulating material, preferably ABS again. It is not only the back terminating part of the insulating body 13; on the contrary, the back plate 57 also serves as a carrier of those partial elements of the coupling location which, as half parts, at the device side, fit to the half parts in the inside of the inserts. In FIG. 3, thus, the back plate 57 exhibits a total of four acceptance cylinders for transmission bodies for energy transmission of which, however, only two can be seen—referenced with 62 and 63—because of the partial illustration. The upper edge of each assembly cylinder 62, 63, etc. which faces away from the back plate 57 is tapered in a ridge-like manner. The shoulder 64 of the ridge tapering of the upper edge, thereby, serves as a seating surface for an assembly plate (151, FIG. 9) which is centered by means of the actual upper edge round ridge 65. The assembly plate is again the carrier of the transmission bodies (e.g. 153, FIG. 9) in a floating suspension. The assembly plate itself is seated on a printed circuit board (159, FIG. 9) on which the electronic components required for the energy transmission and signal transmission are mounted. In the present case, the signal transmission from the insert in the direction of the signal processing parts of the device ensues by means of luminescent diodes, preferably in the infrared range. For this purpose, four light receivers (for example, photodiodes) at the device side are provided as secondary signal coupling elements for a total of four transmit diodes which are disposed as primary signal coupling elements in the respective insert 15 through 18. The mounting niches for the light receivers are indicated on the mounting plate 57 with the numerals 66, 67, etc. Accordingly, insets 68, 69, etc. for transmission diodes are provided on the back plate 57 of the insulating body for signal transmission (switching or other control signals) from the inside of the device housing in the direction of the inserts. The luminescent diodes to be employed there are then the primary coupling elements for a transmit case; the allocated receivers are seated as secondary coupling elements within the insert housing. If, thus, an insert 15 through 18 is inserted into a receiving position of the insulating housing 13 up to its final position, then an automatic coupling connection between coupling elements for energy transmission from the device to the insert and coupling elements for signal transmission both from the insert in the direction toward the device housing as well as from the device housing in the direction toward the insert is produced. In the exemplary embodiment of FIG. 3, the back plate 57, beyond that, also comprises threaded mounting sleeves 70 for screwing the printed circuit board carrying the mounting plate down, and the first two ejectors 71 and 72 of a total of four ejectors for a respective insert can be seen at the left side of the plate 57.

Figure 4:
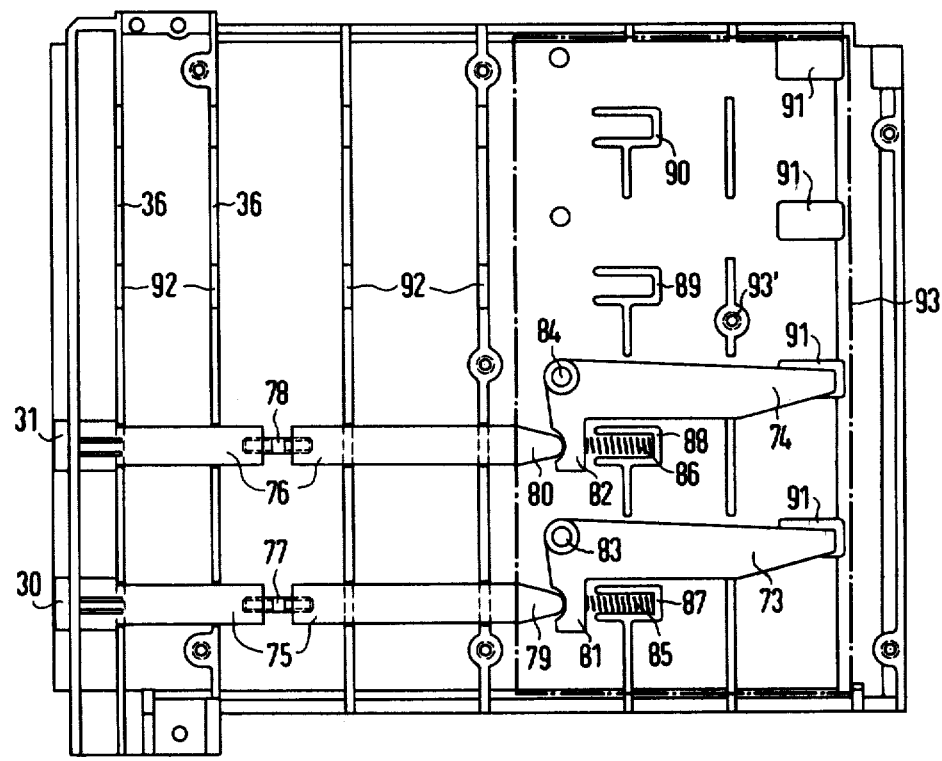
FIG. 4 is a side view of the insulating body with a system of locking levers for locking insert housings in the insulating body.

FIG. 4, as already indicated above, shows the right lateral wall of the insulating body 13 as seen from the opening, the lever system for the locking of the individual inserts 15 through 18 being mounted at said sidewall. For each insert, said lever system thereby comprises a catch lever 73, 74, etc. with the lock noses 53 through 56 illustrated in FIG. 2. An actuation lever 75, 76, etc., is allocated to each catch lever 73, 74, etc., said actuation lever 75, 76, etc. being deflected given pressure on the final unlock key 30, 31, etc. and actuating the catch lever. Each deflection lever 75, 76, etc. is comprised of two parts which can be adjusted to a desired overall length of the lever by means of a respective adjustment screw 77, 78, etc. Beyond that, each deflection lever 75, 76, etc., strikes via a pointed end 79, 80, etc. into a cavity of the end of the lock lever 73, 74, etc. facing away from the lock nose and bent off at approximately 90°. Given pressure on said cavity, accordingly, the lever is rotated toward the inside around its revolute joint 83, 84, etc. against the pressure of a spring 85, 86, etc. which is seated in a niche 87, 88, 89, 90 of the sidewall. Said rotation toward the inside of the one lever end leads to an upward rotation of the other lever end with the latches 53 through 56. The latches 53 through 56 projecting into the inside of the insulating body through the sidewall opening 91 are lifted upwardly. Each latch is lifted out of the corresponding catch groove of the insert and the insert is ejected from the insulating housing by the ejection mechanism. In the locking device of FIG. 4, the longitudinal levers 75, 76, etc. are seated in niches 92 of the ribs of the sidewall. In order to secure the lock lever 73, 74 in addition to the springs 85, 86 against ejection from their support mounts, there serves a synthetic plate 93 (illustrated with dot-dash lines) which is secured in place by means of a screw and a threaded hole 93' at the sidewall of the insulating housing above the levers and springs.

FIG. 5 shows an exemplary embodiment of an insert, for example, of the insert 15 in FIG. 1. Each of the inserts comprises a jacket housing 94 of highly-insulating synthetic material, for example, ABS again, which is open only at its front side. Along its longitudinal edges, the highly-insulating jacket 94 is provided with the aforementioned well-rounded glide channels 95 which are therefore also easy to clean. A latch-receiving groove 96 in which a block 97 consisting of hard synthetic material, particularly polyamide glass fiber, is bonded is situated at the back end of the right upper edge of the insert jacket 94. The hard block 97 protects the locking groove 96 against loads which are all too great due to the latch of the locking lever. The front opening of the jacket housing 94 of each insert is tightly closed with an insert front plate. FIG. 6 shows the back surface of a rear wall 98 of the jacket housing 94. In its center (indicated with broken lines), said rear wall 98 has its material thinned disk-like. The thinning at this location guarantees a particularly tight coupling of the transmission body (e.g. 137, FIG. 9) on the side of the insert to that transmission body (e.g. 153, FIG. 9) on the side of the device at the back plate 57 on the insulating body in the final position of the insert. Reference numerals 100 and 101 indicate two windows for the infrared light of the two signal transmission couplers of each insert. The window may be a red-dyed synthetic material or a true infrared transmitting filter. The two windows are acoustically irradiated into the rear wall 98 by means of ultrasonics in such manner as to be water and airtight as well as high voltage resistant.

Figure 7:
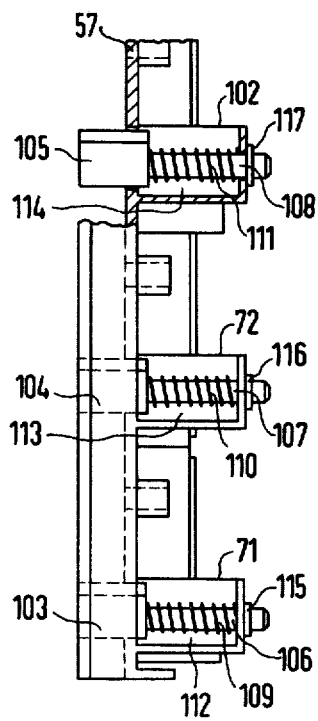
FIG. 7 shows an ejection mechanism for ejecting the insert housings, located at the back surface of the insulating body.

FIG. 7 shows the ejection mechanism at the back plate 57 of the insulating body in detail. In addition to the ejection blocks 71, 72 of FIG. 3, a third ejection block 102 is also illustrated. A fourth ejection block is no longer drawn in because of the partial illustration. Each block 71, 72, 102, etc., comprises a ram element 103, 104, 105, etc. Each of said ram elements is connected to a tappet 106, 107, 108, etc. which is resiliently mounted in the inside face 112, 113, 114, etc. of the respective ejection blocks by means of a helical spring 109, 110, 111, etc. Securing rings 115, 116, 117, etc. serve for the external securing of the tappets. If, thus, an insert is inserted into that level of the insulating housing 13 allocated to it, then, due to the back wall of the insert, the ram element (of elements 103 through 105) together with one of the tappets 106 through 108, etc., situated at the level is pressed toward the back against the pressure of the associated one of springs 109 through 111 surrounding the tappets. Finally, the insert retained in its final position by means of one of latches 53 through 56 of the lock levers 73, 74, etc. presses against the ram element (103 through 105, etc., until the locking is released by means of the lock lever by means of pressure on the appertaining unlock key (30 through 33) of the system of locking levers. The spring power of the cocked spring (109 through 111) then insures that the insert is ejected by the ejection element (103 through 105) from the inside of the insulating body, at least to such degree that it can be easily grasped by hand at its front side and be withdrawn. In a preferred embodiment, each tappet also trips a switch, particularly a microswitch, in such manner that the current supply to the primary transmitter on the device side is interrupted when an insert is ejected.

As an exemplary embodiment, FIG. 8 shows the internal format of an insert 15 through 18. Said internal format is characterized in that a total of two printed circuit boards 120 and 121 are mounted between the front part 118 of the insert and a back part 119 in the manner of a plug-type connection. The essential electronic components for energy and signal transmission are mounted on said printed circuit boards. This partial structure comprised of front and back surface as well as printed circuit boards, finally, is covered in a sandwich manner by means of two metallic shielding plates 122 and 123 (for example, consisting of aluminum or non-magnetic sheet steel). Both shielding plates 122 and 123 are provided with claws 124 or, respectively, 125 at the front edge. When the respective plate is seated with flat edges 126, 127 or, respectively, 128, 129 on the inside shoulder of the front plate 118, the claws 124 or, respectively, 125 engage in recesses below the shoulder, so that a type of clamped connection for supporting the front edge of the two plates 122 and 123 is produced at the shoulder. The back edges 130 or, respectively, 131 of the plates 122 and 123, on the other hand, rest on the edges of the back part 119. They are screwed to the back part via screw holes 132, 133 or, respectively, 134, 135. The central parts of the shielding plates 122, 123, via claws 136, lie resiliently against the side edges of the printed circuit boards 120 and 121. In the same embodiment of FIG. 8, the back part 119 is fabricated of metallized synthetic material for the purpose of shielding. The back part 119, at the same time, is the carrier of half parts of coupling locations for energy and signal transmission. Thus, among other things, it carries a pot core in floating suspension for the acceptance of a coil body as a secondary part of a coupling location for energy transmission from the device to the insert. For signal transmission from the insert to the device, an inset for a transmit diode 138 (luminescent diode) is disposed at the left side and, for signal transmission from the device to the insert, a niche for a light receiver 139 (photodiode) is disposed at the right-hand side. A signal cable line 140 serves for the line-wise connection between the front plate 118 (foil front plate with integrated switches) of the insert and printed circuit boards 120, 121, whereas a signal cable line 141 is provided for the connection of the printed circuit boards to one another. A plug-type connection 142, 143 serves for the production of a line connection for the energy transmission from the coil body seated in the pot core 137 to the appertaining circuit part on the printed circuit boards. The plug 142 is seated at the back part 119; the plug 143 is disposed on the printed circuit board 120. In its assembled state, the overall structure of FIG. 8 can be inserted into the highly-insulating jacket housing 94 of the insert from the front side. An insert as is illustrated in FIG. 5 thus results.

Figure 9:
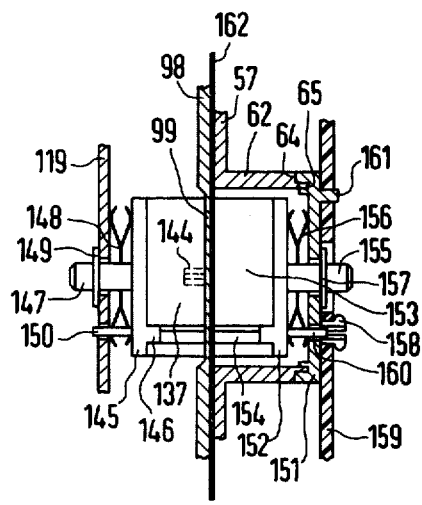
FIG. 9 shows a coupling element for energy connection, partially in section.

In a sectional detail, FIG. 9 shows a coupling location for energy transmission as is produced when an insert is brought into its final position in the insulating housing. In a partial sectional illustration, accordingly, the rear wall 98 of the insert housing 94 with a material thinning 99 in its center is again illustrated. The material thinning 99 is also provided with a centering cross 144. The transmitter carrier is referenced with 145. Said carrier carries the pot core 137 on the insert side already illustrated in FIG. 8 for acceptance of the coil body at the secondary side. The pot core 137 is slotted at 146, and the connection wires for the coil body are simultaneously conducted through the slot 146. The transmitter carried together with pot core and coil body is resiliently suspended by means of a suspension nipple 147 upon incorporation of a spring 148 at the back part 119. A retaining ring 149 secures the arrangement against falling out.

The suspension of the transmitter on the side of the device presents a similar structure. The back plate of the insulating housing 13 is again referenced with 57. In accord with FIG. 3, the back plate 57 carries, for example, the assembly cylinder 62 with shoulder 64 and centering ridge 65 of the ridge tapering of the upper edge. The mounting plate 151 for a transmitter carrier 152 at the device side with mounted pot core 153 with slot 154 for the coil body at the device side is seated on the upper edge of the acceptance cylinder 62 shaped in such manner. The transmitter structure is again suspended in a floating manner at the assembly plate 151 by means of support nipple 155 and spring 156 as well as retaining ring 157. The carrier of the assembly plate 151 is a printed circuit board 159 which carries the electronic components necessary for energy and signal transmission. A snap nipple 158 which is simply snapped into the printed circuit board serves for securing the assembly plate 151 to the printed circuit board 159. A mounting pin 160 between the transmitter carrier 152 and assembly plate 151 again serves to prevent twisting as does a pin 161 between the assembly plate 151 and the printed circuit board 159, whereas 162 is a very thin sealing foil which is stretched over the inside surface of the back plate 57.

Thus, what is achieved with the invention is not only that coupling capacitances between metal parts in the inside of the inserts and metal parts in the inside of the device housing can be kept as small as possible even given large volume or, respectively, large-surface design of the plug-in type connection so that the leakage current also becomes negligibly small; but, beyond that, due to the special shaping of the insulating body and due to its particularly functional combination with further components such as, for example, ejection mechanism in conjunction with locking device, structural allocation of the individual components of each coupling location to one another, etc., a device is created which can be optimally and space-savingly employed in the sense of the invention. The illustrated embodiment itself has only exemplary character; it is self-understood that modifications of the structure described are possible in any desired form within the framework of the invention.

It will be apparent that many modifications and variations may be effected without departing from the scope of the novel concepts and teachings of the present invention.

We claim as our invention:

1. A device for acquiring and processing electrical signals, comprising a device housing with a signal processing part, at least one insert including an insert housing of insulation material and electrically conductive insert means carried thereby, said insert being insertable in said device housing as a signal transmission part, cooperating coupling elements for disposition in a cooperating relationship to define a galvanically separating coupling location therebetween and so as to provide for at least one of energy and signal transmission between said coupling elements via the galvanically separating coupling location therebetween without any galvanically conductive path between said coupling elements, one of said cooperating coupling elements being carried with said insert, an insulating body mounted at the interior of the device housing, said insulating body being of insulating material and having an interior space removably receiving the insert housing and having the other of the cooperating coupling elements mounted at said interior space such that with the insert in said interior space of said insulating body said one and said other of said cooperating coupling elements are disposed in said cooperating relationship, said insert when positioned in said interior space being electrically isolated against capacitive leakage current not only by the insulation material of the insert housing but additionally by the insulating material of said insulating body, characterized in that the insulating body is formed of two mating C-shaped insulating parts which, when connected together, form a box housing which is open at the front and back, and means comprising the insulation material of said insulating body for isolating said insert against capacitively coupled leakage current, said device housing having a signal processing part, characterized in that the box housing exhibits a respective insertion groove at two opposite edges at the back thereof, and an insulated back plate engageable in said insertion grooves for covering the open back of the box housing, said back plate being the carrier of one of the cooperating coupling elements and connecting the same with the device housing, said cooperating coupling elements providing for signal transmission between the signal transmission part of the insert and the signal processing part in said device housing.

2. A device according to claim 1, characterized in said two mating C-shaped insulating parts together with the back plate inserted into the grooves of the box housing providing an insulating assembly having a front opening and being only open at the front side, the two mating C-shaped insulating parts having means providing for threaded fastening thereof with only two screws in the area of the front opening and means comprising two further screws for securing the upper edge of the back plate to the upper back edges of the mating C-shaped insulating parts, said insulation assembly having means providing oblique surfaces in the region of said grooves such that the back lower edges of the two mating C-shaped insulating parts are automatically pressed together in the manner of a wedge fit via the oblique surfaces as a result of the insertion of the back plate into assembled relation with the grooves.

3. A device according to claim 1, with the back plate having acceptance means providing acceptance spaces at successive levels one above the other, a transmitter body in each acceptance space, a plurality of inserts each having an insert housing and insert means to be inserted therewith into the box housing, said transmitter body respectively representing one of said coupling elements of a coupling location for energy transmission, the other of said primary and secondary coupling elements being connected to the respective insert.

4. A device according to claim 3, with the acceptance means providing the respective acceptance space having a rear edge facing away from the back plate and being thinned in a ridge-like manner and providing a rearwardly projecting ridge and an adjacent shoulder for serving as a seating surface, an assembly plate engageable over the ridge as a centering means and being seated against said shoulder, each assembly plate being the carrier for an associated transmitter body and mounting the associated transmitter body in one of the acceptance spades.

5. A device according to claim 4, characterized in that the transmitter body is suspended in a floating and resilient manner at the assembly plate.

6. A device according to claim 4, with a printed circuit board having the electronic components required for energy transmission and signal transmission mounted thereon, and being secured with the assembly plate.

7. A device according to claim 3, with the back plate of the insulating housing having niches and insets which serve for the acceptance of light receivers for effecting signal transmission from the insert to the device and for the acceptance of light transmitters for effecting signal transmission from the device to the insert.

8. A device according to claim 7, characterized in that a light transmitter as as primary component on as side of as insert is allocated to each light receiver on the side of the back plate as a secondary component, and a light receiver as a secondary component on as side of the insert is allocated to a light transmitter as as primary component of the signal coupling location on as side of the back plate.

9. A device according to claim 7, characterized in that luminescent diodes are mounted at said insets to serve as light transmitters and photodiodes are mounted at said niches to serve as light receivers.

10. A device for acquiring and processing electrical signals, comprising a device housing with a signal processing part, at least one insert including an insert housing of insulation material and electrically conductive insert means carried thereby, said insert being insertable in said device housing as a signal transmission part, cooperating coupling elements for disposition in a cooperating relationship to define a galvanically separating coupling location therebetween and so as to provide for at least one of energy and signal transmission between said coupling elements via the galvanically separating coupling location therebetween without any galvanically conductive path between said coupling elements, one of said cooperating coupling elements being carried with said insert, an insulating body mounted at the interior of the device housing, said insulating body being of insulating material and having an interior space removable receiving the insert housing and having the other of the cooperating coupling elements mounted at said interior space such that with the insert in said interior space of said insulating body said one and said other of said cooperating coupling elements are disposed in said cooperating relationship, said insert when positioned in said interior space being electrically isolated against capacitive leakage current not only by the insulation material of the insert housing but additionally by the insulating material of said insulating body, characterized in that an ejection mechanism is allocated to each insert at the inside of the insulating body, a locking device for locking the insert in the insulating body after it has been inserted, and an unlocking key coupled with said locking device, and disposed at the device housing and being manually actuatable to release said locking device, said ejection mechamism upon release of the locking device being operable to effect ejection of the insert, characterized in that said ejection mechanism comprises a ram element engageable with each insert, a compression spring coupled with said ram element, said ram element being disposed at the back plate of the insulating body in such manner that an insert brought into lock position relative to said locking device in the insulating body presses the ram element away against the pressure of the allocated compression spring, said compression spring, upon release of the locking device, ejecting the insert out of the interior space of the insulating body.

11. A device for acquiring and processing electrical signals, comprising a device housing with a signal processing part, at least one insert including an insert housing of insulation material and electrically conductive insert means carried thereby, said insert being insertable in said device housing as a signal transmission part, cooperating coupling elements for disposition in a cooperating relationship to define a galvanically separating coupling location therebetween and so as to provide for at least one of energy and signal transmission between said coupling elements via the galvanically separating coupling location therebetween without any galvanically conductive path between said coupling elements, one of said cooperating coupling elements being carried with said insert, an insulating body mounted at the interior of the device housing, said insulating body being of insulating material and having an interior space removable receiving the insert housing and having the other of the cooperating coupling elements mounted at said interior space such that with the insert in said interior space of said insulating body said one and said other of said cooperating coupling elements are disposed in said cooperating relationship, said insert when positioned in said interior space being electrically isolated against capacitive leakage current not only by the insulation material of the insert housing but additionally by the insulating material of said insulating body, characterized in that an ejection mechanism is allocated to each insert at the inside of the insulating body, a locking device for locking the insert in the insulating body after it has been inserted, and an unlocking key coupled with said locking device, and disposed at the device housing and being manually actuatable to release said locking device, said ejection mechamism upon release of the locking device being operable to effect ejection of the insert, said insert housing having a retention groove at the perimeter thereof, the locking device for each insert comprising a lever system including a catch lever, said lever system being disposed at a sidewall of the insulating body and including a latch engaging into the retention groove at the perimeter of the insert housing when the insert housing is brought into its final position within the insulating body.

12. A device for acquiring and processing electrical signals, comprising a device housing with a signal processing part, at least one insert including an insert housing of insulation material and electrically conductive insert means carried thereby, said insert being insertable in said device housing as a signal transmission part, cooperating coupling elements for disposition in a cooperating relationship to define a galvanically separating coupling location therebetween and so as to provide for at least one of energy and signal transmission between said coupling elements via the galvanically separating coupling location therebetween without any galvanically conductive path between said coupling elements, one of said cooperating coupling elements being carried with said insert, an insulating body mounted at the interior of the device housing, said insulating body being of insulating material and having an interior space removable receiving the insert housing and having the other of the cooperating coupling elements mounted at said interior space such that with the insert in said interior space of said insulating body said one and said other of said cooperating coupling elements are disposed in said cooperating relationship, said insert when positioned in said interior space being electrically isolated against capacitive leakage current not only by the insulation material of the insert housing but additionally by the insulating material of said insulating body, characterized in that the insulating body is designed for the acceptance of a plurality of inserts each including an insert housing and electrically conductive insert means, said insert housings each comprising a jacket housing of highly insulating synthetic material, and said electrically conductive insert means comprising circuit components for energy and signal transmission thereon, and metallic shielding plates in shielding relation to said circuit components, the jacket housing for each insert having well-rounded glide grooves instead of longitudinal edges, said insulating body having at opposite sides of its interior space longitudinal rails disposed at a plurality of levels, said longitudinal rails being shaped in such manner that a relatively flat wall camber serving as a sidewall guide is followed by a more strongly cambered longitudinal ridge as a rail seat for the insert.

13. A device for acquiring and processing electrical signals, comprising a device housing with a signal processing part, a plurality of inserts, each insert including an insert housing of insulation material, said inserts being insertable in said device housing as respective signal transmission parts, cooperating pairs of coupling elements each pair for disposition in a cooperating relationship to define a galvanically separating coupling location therebetween and so as to provide for at least one of energy and signal transmission between such pair of coupling elements via the galvanically separating coupling location therebetween without any galvanically conductive path between such pair of coupling elements, one of said cooperating coupling elements of each pair being carried with a respective one of said inserts, an insulating body mounted at the interior of the device housing, said insulating body being of insulating material and having an interior space removably receiving the insert housings of said inserts and having the other of the cooperating coupling elements of said pairs mounted at said interior space such that with the inserts in said interior space of said insulating body said one and said other of said cooperating coupling elements of each pair are disposed in said cooperating relationship, said inserts when positioned in said interiorspace being electrically isolated against capacitive leakage current not only by the insulation material of the insert housing but additionally by the insulating material of said insulating body, nonmagnetic electrically conducting material at the exterior of said insulating body, the insulating body having a wall with externally protruding ribs around its perimeter which hold the internal wall surface of the insulating body at a predetermined distance from the electrically conducting material, thereby limiting to a minimum the capacitance prevailing between metal parts at the inside of the insulating body and the electrically conducting material at the exterior thereof, said plurality of inserts each including a respective insert housing, the insulating body being in the form of a box housing open at the front side to provide a front opening, the insulating body having at opposite sides of its interior space longitudinal rails disposed at a plurality of levels, the interior space of the box housing thereby providing a plurality of individual levels one above the other and accessible via the front opening and accommodating the respective insert housings of said inserts.

14. A device according to claim 13, characterized in that the box housing forming the insulating body exhibits outside dimensions corresponding to those which fit within a receiving space of a traditional device housing.

15. A device according to claim 13, characterized in that each insert forms an independent signal transmission part, and has signal cable receiving means for connecting the independent signal transmission part with a signal source.

16. A device according to claim 13 with means comprising the insulating material of said insulating body isolating said insert against capacitively coupled leakage current so as to ensure a low level of less than ten microamperes.

17. A device according to claim 13, characterized in that the insulating body having said protruding ribs is of shaped amino-butadiene-styrol (ABS).

18. A device according to claim 17, characterized in that, with reference to an operating voltage of 220 volts (220 V) and an operating frequency of fifty Hertz (50 Hz) the insulating body is designed in such manner that its limits the capacitance between inside metal parts and the exterior electrically conducting material to a value of less than 130 picofarads (<130 pF).

19. A device according to claim 18, characterized in that the box housing has a two inch width and an eight inch insertion depth in its outside dimensions.

20. A device according to claim 19, characterized in that respective signal cable receiving means connect the independent signal transmission parts with sensors for physiological test signals.

21. A device for acquiring and processing electrical siganls, comprising a device housing with a signal processing part, at least one insert including an insert housing of insulation material and electrically conductive insert means carried thereby, said insert being insertable in said device housing as a signal transmission part, cooperating coupling elements for disposition in a cooperating relationship to define a galvanically separating coupling location therebetween and so as to provide for at least one of energy and signal transmission between said coupling elements via the galvanically separating coupling location therebetween without any galvanically conductive path between said coupling elements, one of said cooperating coupling elements being carried with said insert, an insulating body mounted at the interior of the device housing, said insulating body being of insulating material and having an interior space removable receiving insert housing and having the other of the cooperating coupling elements mounted at said interior space such that with the insert in said interior space of said insulating body said one and said other of said cooperating coupling elements are disposed in said cooperating relationship, said insert when positioned in said interior space being electrically isolated against capacitive leakage current not only by the insulation material of the insert housing but additionally by the insulating material of said insulating body, characterized in that an ejection mechanism is allocated to each insert at the inside of the insulating body, a locking device for locking the insert in the insulating body after it has been inserted, and an unlocking key coupled with said locking device, and disposed at the device housing and being manually actuatable to release said locking device, said ejection mechanism upon release of the locking device being operable to effect ejection of the insert, characterized in that said ejection mechanism comprises a ram element engageable with each insert, a compression spring coupled with said ram element, said ram element being disposed at the back plate of the insulating body in such manner that an insert brought into lock position relative to said locking device in the insulating body presses the ram element away against the pressure of the allocated compression spring, said compression spring, upon release of the locking device, ejecting the insert out of the interior space of the insulating body, said insert housing having a retention groove at the perimeter thereof, the locking device for each insert comprising a lever system including a catch lever, said lever system being disposed at a sidewall of the insulating body and including a latch engaging into the retention groove at the perimeter of the insert housing when the insert housing is brought into its final position within the insulating body.

* * * * *